(12) United States Patent
Kubo et al.

(10) Patent No.: US 7,029,224 B2
(45) Date of Patent: Apr. 18, 2006

(54) METHOD AND APPARATUS FOR TRANSFERRING A THIN PLATE

(75) Inventors: Keishi Kubo, Moriguchi (JP); Keiichi Yoshizumi, Higashiosaka (JP); Hiroyuki Takeuchi, Hirakata (JP); Koji Handa, Osaka (JP); Takaaki Kassai, Settsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 261 days.

(21) Appl. No.: 10/384,791

(22) Filed: Mar. 11, 2003

(65) Prior Publication Data
US 2004/0037690 A1 Feb. 26, 2004

(30) Foreign Application Priority Data
Mar. 12, 2002 (JP) .............................. 2002-067407

(51) Int. Cl.
*B25J 17/02* (2006.01)
(52) U.S. Cl. .................. 414/680; 74/490.06; 414/736; 907/29

(58) Field of Classification Search ................ 414/729, 414/736, 680; 74/490.01, 490.06; 901/29
See application file for complete search history.

(56) References Cited

U.S. PATENT DOCUMENTS 4,821,972 A * 4/1989 Grollimund et al. .... 414/736 X

* cited by examiner

*Primary Examiner*—Donald W. Underwood
(74) *Attorney, Agent, or Firm*—Greenblum & Bernstein, P.L.C.

(57) ABSTRACT

A method for transferring a thin plate is provided, in which three or more grasping claws of a transfer arm grasp the periphery of the thin plate in order to transfer it to a predetermined transfer position, and three or more holding claws hold the periphery of the thin plate in the transfer position. The transfer arm rotates about a shaft which is in a direction of a vector sum of a first vector perpendicular to a surface of the thin plate before transfer, and a second vector perpendicular to the surface of the thin plate after the transfer, to transfer the thin plate with changing the posture thereof.

7 Claims, 9 Drawing Sheets

Fig. 9
Prior Art

# METHOD AND APPARATUS FOR TRANSFERRING A THIN PLATE

BACKGROUND OF THE INVENTION

1. Field of the Invention

The present invention relates to a method and apparatus for transferring a thin plate for use in transferring a thin plate such as a wafer for manufacturing a semiconductor, a substrate for a magnetic disc, and the like.

2. Description of the Related Art

A wafer for manufacturing a semiconductor comprises a thin plate of silicon and the like. Semiconductor devices and electronic circuits are made on the surface of a wafer with photo engraving technology and various types of microfabrication technology. In processing such a wafer, it is necessary to securely transfer the wafer with holding only the vicinity of the periphery thereof, in order to prevent a defect and quality deficiency from occurring due to dust and the like adhering to the surface thereof, and to increase an effective chip area.

Recently, for the purpose of realizing finer-line processes of semiconductor devices and improving productivity thereof, a wafer increasing in size from conventional 200 mm to 300 mm is used, and the semiconductor devices and the electronic circuits made on the wafer also become denser. In accordance with increase in size of the thin plate like this, it becomes more and more important to securely transfer the thin plate in a clean state while holding only the periphery of the thin plate.

Correct and efficient transfer of a wafer is effective at reducing cost for manufacturing and testing, by means of increasing the number of processed wafers per one semiconductor manufacturing equipment. In a case of a measuring device which takes about one minute for measurement per one wafer, for example, it is necessary to mount the wafer within twenty seconds.

Figure 9:
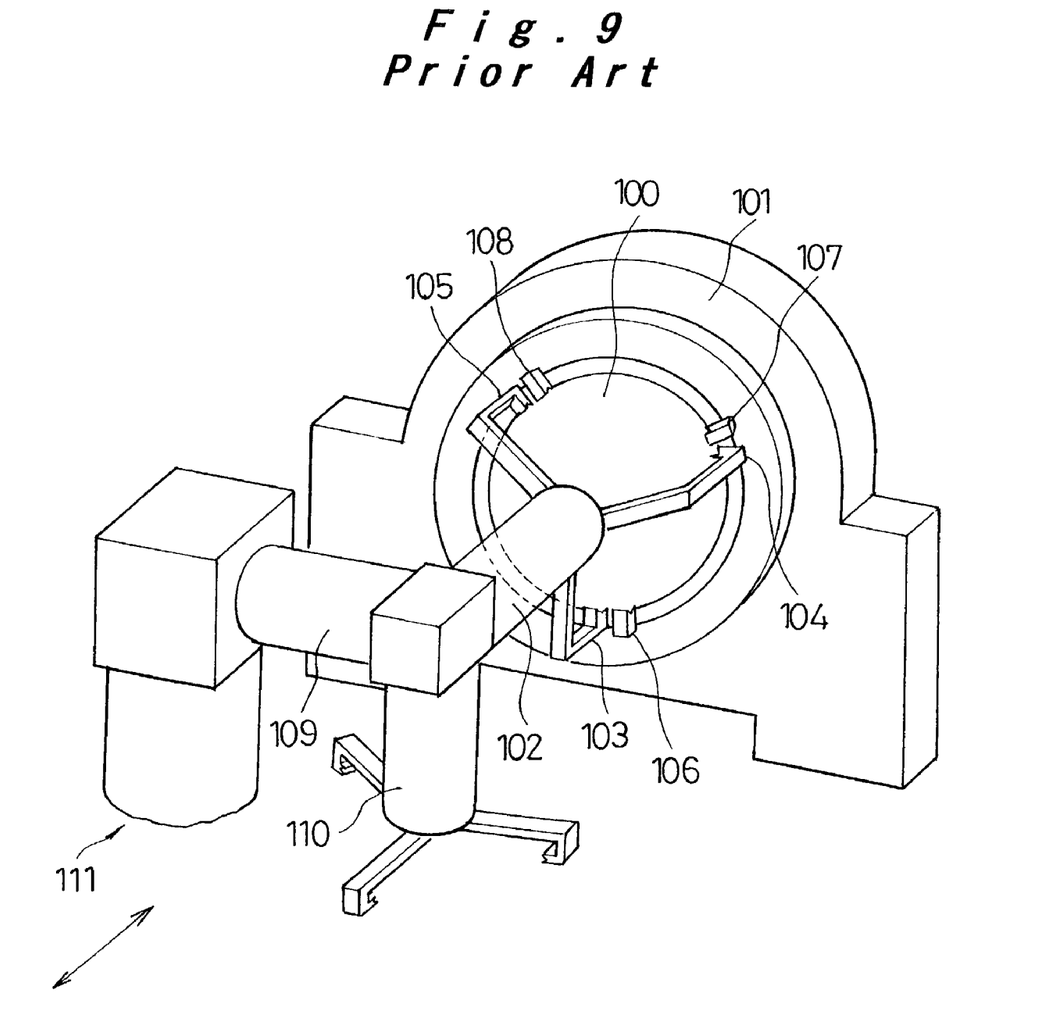
FIG. 9 is a perspective view of a conventional wafer transfer unit.

FIG. 9 shows a flatness measuring device for a wafer 100. The device is provided with a transfer arm 102 for transferring the wafer 100 to a measuring unit 101. The transfer arm 102 attached to a main body of the device is rotatable and movable in a horizontal direction. The transfer arm 102 comprises a first arm 103 with a claw for grasping a lower edge of the wafer 100 from beneath, and second and third arms 104 and 105 with claws for grasping an upper edge of the wafer 100 from two directions above the wafer 100. The measuring unit 101 has three holder claws 106, 107, and 108 for holding three spots in the outer edge of the wafer 100. An arrow in FIG. 9 shows a movable direction of the transfer arm 102.

The first to third arms 103 to 105 of the transfer arm 102 holds the wafer 100 and transfer it to the measuring unit 101. Then, the three holder claws 106 to 108 of the measuring unit 101 hold the wafer 100 on the measuring unit 101.

A transfer method will be hereinafter described in detail. After the transfer arm 102 moved by a holder unit 111 is brought near to the measuring unit 101 until an edge sensor attached on the edge of each arm 103 to 105 is actuated, an actuator for controlling deviating positions of the arms 103 to 105 is driven by signals from the sensor. The actuator conducts feedback control of the position of the arms so that the edge of the wafer 100 is positioned in the middle of the predetermined groove of the claw. Then, the whole wafer 100 is lifted by actuating a cam, by which the three claws on the edges of the arms are moved in a radius direction of the wafer. Then, a movable edge claw of the measuring unit 101 moves toward the wafer to receive the thin plate, wafer 100 with the claws 106 to 108 of the main body. After an edge detection sensor and a deviating position detection sensor confirm that the wafer is mounted on the measuring unit 101 by means of opening claws of three arms with the cam, the transfer arm 102 moves leftward and the transfer is completed.

To dismount the wafer 100, a transfer arm 110 shown in a lower portion of FIG. 9 is operated in a similar way with the rotation of a rotational shaft 109. To pass the wafer 100, both of the transfer arm for mounting 102 and the transfer arm for dismounting 110 are used.

In the conventional transfer method described above, however, a hand section passes above the wafer when the wafer is mounted on and dismounted from the measuring unit 101. Thus, there is a problem that the dust and the like falling down from the hand section tends to adhere to the wafer which is required to be clean.

In the flatness measuring device, three sensors are provided on the edges of the placement arms, and the positions thereof are sent back to conduct a feedback control. Thus, a control circuit which requires delicate adjustment is necessary for the purpose. Therefore, there are problems that a large amount of cost is necessary to adjust the assembly of the device, and the maintenance thereof is difficult.

The edge claws on the main body side are made of plastic to reduce dust, and plastic portions must be exchanged almost once a month. It is difficult to make an identical part with precision to less than 0.1 mm, due to the characteristics of the plastic. The exchanged plastic portions have to be attached on proper positions, so that the wafer does not eccentrically deviate with respect to the measuring unit. Thus, there is a problem that man-hour for adjustment increases.

In this way, the adjustment of the transfer unit including the actuator is troublesome in the conventional transfer unit. The conventional transfer unit also has the high risk of adhesion of dust on the top surface of the wafer. Furthermore, there is a problem that it is difficult to attach and adjust the wafer holder claws in exchanging.

SUMMARY OF THE INVENTION

In view of the above conventional problems, an object of the present invention is to provide a method and apparatus for transferring a thin plate, by which a thin plate, which is extremely thin and easy to warp, is held and reliably and rapidly attached to an attachment section having a small holding margin without the adhesion of dust and the like.

To achieve the above object, a method for transferring a thin plate according to the present invention transfers the thin plate with changing a posture thereof. A transfer arm for holding the thin plate rotates about a shaft which is in a direction of a vector sum of a first vector perpendicular to a surface of the thin plate before transfer, and a second vector perpendicular to the surface of the thin plate after the transfer, when the magnitude of the first and second vectors is equal to each other, for the purpose of changing the position of the thin plate. According to the method, a movable portion such as the transfer arm changes the posture of the thin plate and transfer the plate without passing above the thin plate, so that the dust and the like do not fall down on the thin plate, which is required to be clean.

Using the two transfer arms, one of which is for mounting the thin plate and the other is for dismounting thereof, makes it possible to efficiently receive the thin plate from a transfer position and transfer it thereto.

In a case where the surface of the thin plate before the transfer and the surface thereof after the transfer form an angle of 90 degrees, it is preferable to rotate the transfer arm about the shaft on the surface of 45 degrees, which is in the middle of the surfaces before and after the transfer, for the purpose of changing the posture of the thin plate.

In a method for transferring a thin plate according to the present invention, three or more grasping claws provided in a transfer arm grasp the periphery of a thin plate to move it to a predetermined transfer position. Each grasping claw of the transfer arm is brought close to three or more holding claws provided in the transfer position. The transfer arm is moved in such a manner that a first contact face, which is provided in the transfer arm so as to move together with each grasping claw, makes closely contact with a second contact face provided in the transfer position corresponding to the first contact face. Then, the grasping claws are gradually moved by elastic biasing force to transfer the thin plate from the grasping claws of the transfer arm to the holding claws of the transfer position with the first and second contact faces being in contact with each other. If the position of the transfer arm deviates due to the vibration and the long-term use of a unit, it is possible to surely transfer the thin plate to the holding claws of the transfer position with avoiding contact between the grasping claws and the holding claws, without a complex and expensive control device.

Dust is aspirated in the vicinity of the first contact face or the second contact face, or in the vicinity of the first and second contact faces so that the thin plate is cleanly transferred without the adhesion of the dust occurring when the first and second contact faces make contact with each other.

In a method for transferring a thin plate according to the present invention, three or more grasping claws provided in a transfer arm grasp the periphery of the thin plate to move the thin plate to a predetermined transfer position. The periphery of the thin plate is held with three or more holding claws in the transfer position. A V-shaped holding groove is concentrically formed in the periphery of the holding claw, and the holding claw rotates about a shaft the position of which deviates from the center of the V-shaped holding groove, for the purpose of adjusting the position of said thin plate with rotation. When the holding claw is worn out due to the long-term use and the like, it is possible to easily align the holding claws, the position of which has to be delicately adjusted, with adjusting the position in a rotational direction. This also makes maintenance easy.

The combination of the above methods produces their effect simultaneously.

An apparatus for transferring a thin plate according to the present invention has a transfer arm for grasping the thin plate rotatable about a shaft which is in a direction of a vector sum of a first vector perpendicular to a surface of the thin plate before transfer, and a second vector perpendicular to the surface of the thin plate after the transfer, when the magnitude of the first and second vectors is equal to each other.

It is preferable that the apparatus for transferring a thin plate is provided with the two transfer arms, one of which is used for mounting the thin plate, and the other is used for dismounting it.

An apparatus for transferring a thin plate according to the present invention comprises a transfer arm for grasping the periphery of the thin plate with three or more grasping claws; a transfer portion for holding the periphery of the thin plate with three or more holding claws, the thin plate being transferred from the grasping claws of the transfer arm to the holding claws of the transfer portion with the grasping claws being close to the holding claws; a first contact face provided in the transfer arm for positioning, the first contact face moving together with the grasping claws; a second contact face provided in the transfer portion for positioning, the second contact face corresponding to the first contact face; a spring mechanism provided in the transfer arm for biasing each of the grasping claws, to move the grasping claws at proper distance in the thickness direction of the thin plate; and an actuator provided in the transfer arm for switching the grasping claws between a fixed state and a movable state.

It is preferable that the apparatus for transferring a thin plate is provided with a sensor for detecting deviation of the thin plate with respect to each holding claw in a thickness direction and in a radial direction.

The apparatus for transferring a thin plate may have a dust aspiration mechanism disposed in the vicinity of the first contact face, in the vicinity of the second contact face, or in the vicinity of the first and second contact faces.

An apparatus for transferring a thin plate according to the present invention comprises transferring means for holding the thin plate with three or more grasping claws of a transfer arm and moving the thin plate to a predetermined transfer position; holding means for holding a periphery of the thin plate with three or more holding claws in the transfer position, a V-shaped holding groove being concentrically formed in the periphery of each of the holding claws; and alignment means for aligning the holding claws in a rotational direction thereof, an attachment hole of the holding claw being disposed in a different position from the center of the concentric V-shaped holding groove.

The combination of any of the above devices constitutes the apparatus for transferring a thin plate according to the present invention.

Each of the above transfer apparatuses carries out the above transferring method of the thin plate in order to produce its effect.

A method for manufacturing a substrate according to the present invention comprises the step of transferring a thin plate to a predetermined transfer position by means of the transferring method described above; and measuring the thin plate to determine whether the thin plate is to be rejected or not.

The above and other objects and advantages of the present invention will become apparent from the following detailed description of the preferred embodiment when read in association with the accompanying drawings.

BRIEF DESCRIPTION OF THE DRAWINGS

FIGS. 8A and 8B show position detecting conditions of the wafer according to the embodiment.

DETAILED DESCRIPTION OF THE PREFERRED EMBODIMENTS

An embodiment of a transfer unit for use in transferring a thin plate according to the present invention will be hereinafter described with reference to FIGS. 1 to 8B. This embodiment is a concrete example of the present invention, and does not limit the technical scope of the present invention.

Figure 1:
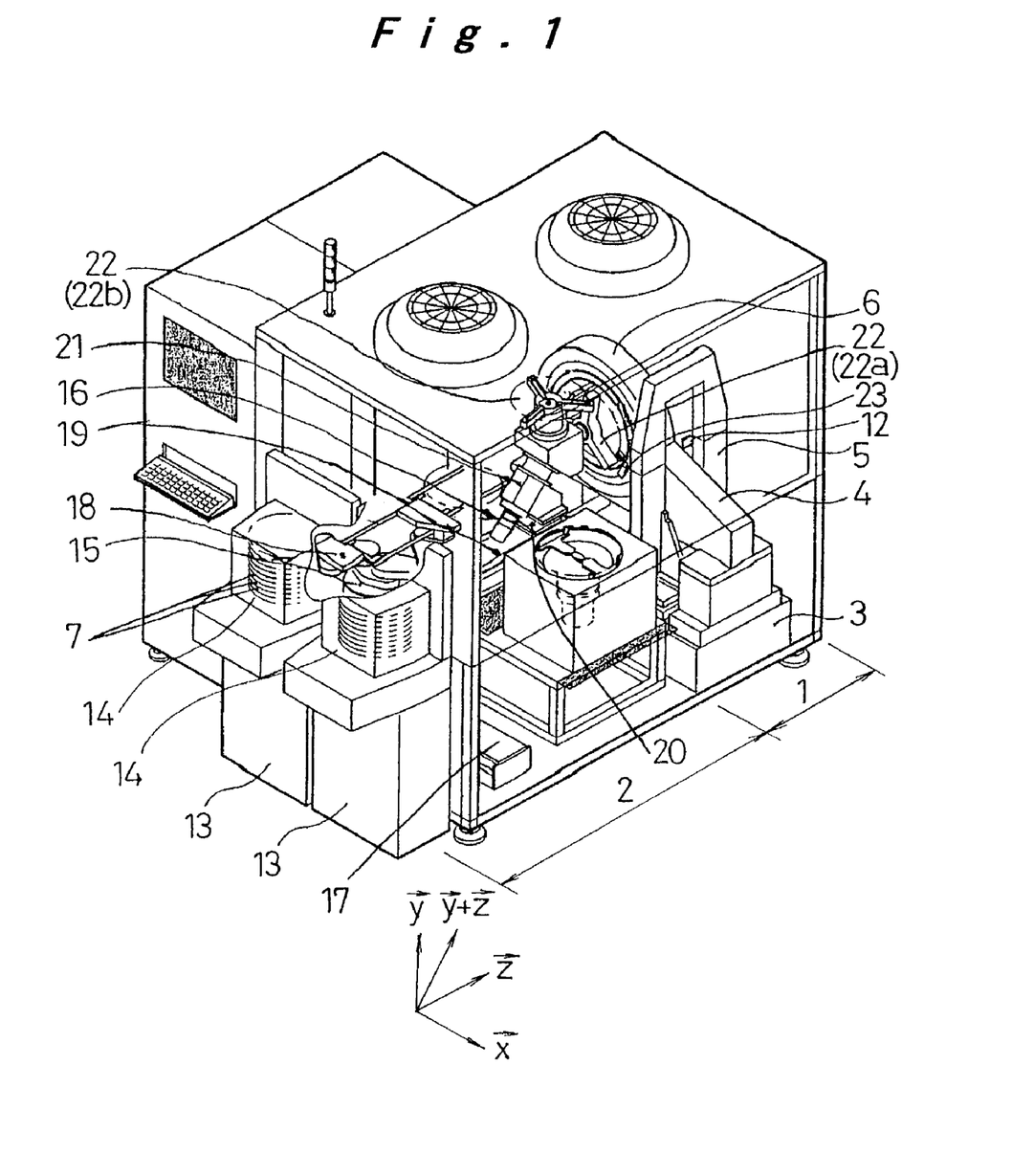
FIG. 1 is a general schematic perspective view of a measuring device for the flatness of a semiconductor wafer in which a transfer unit for use in transferring a thin plate according to an embodiment of the present invention is installed.

FIG. 1 shows a measuring device for flatness of a semiconductor wafer in which a transfer unit of a thin plate according to the present invention is installed. The measuring device comprises a main unit 1 and a transfer unit 2.

Figure 2:
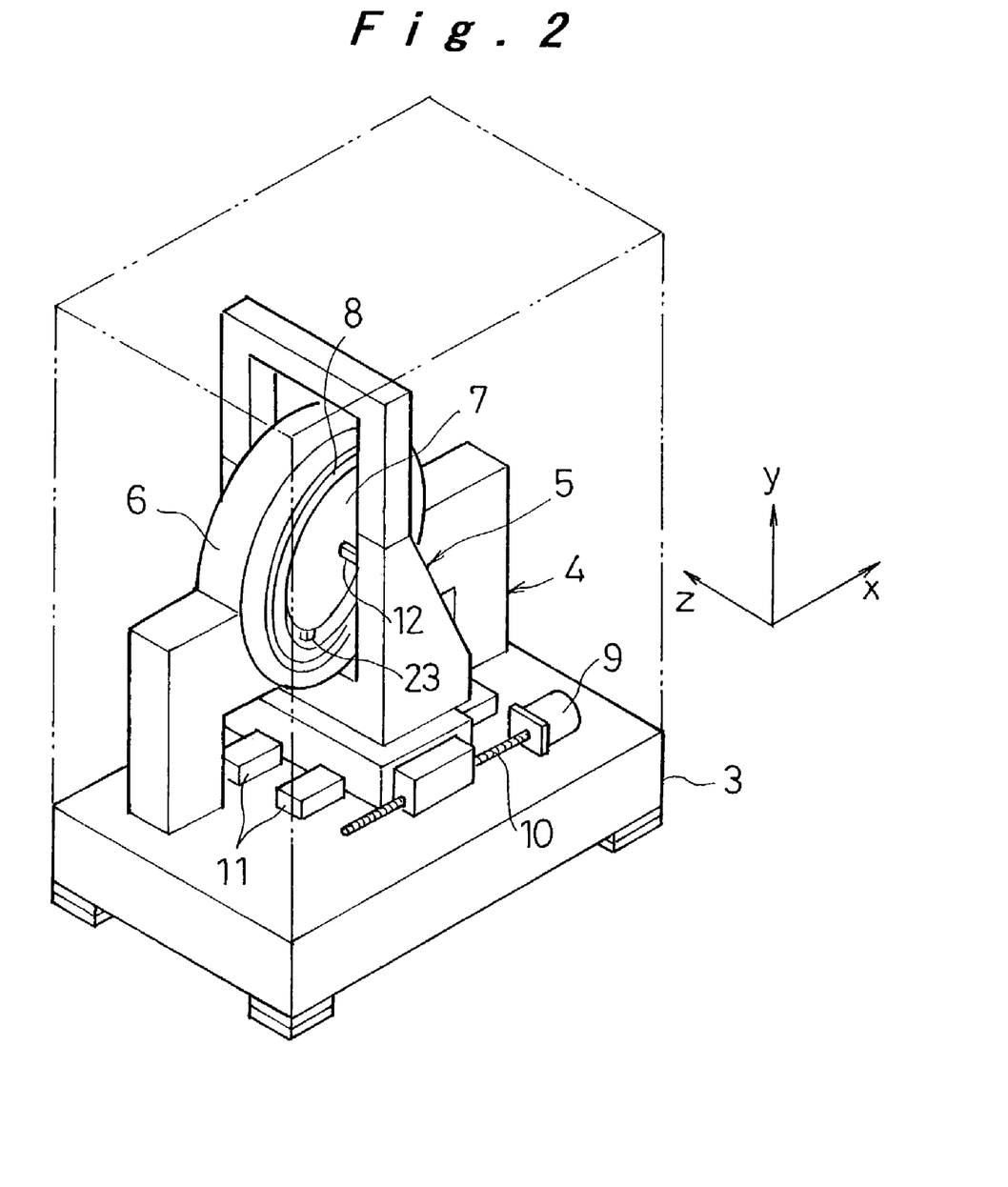
FIG. 2 is a perspective view of a main unit according to the embodiment.

Referring to FIG. 2, the main unit 1 is provided with a wafer holding stage 4 and a sensor movement stage 5 which are disposed on a base 3. The wafer holding stage 4 has a direct drive motor 6, and a circular spindle 8 which are rotated by the direct drive motor 6 on an X-Y plane. A wafer 7 is held on the inner radius of the spindle 8. The sensor movement stage 5 is movable by means of a ball screw 10 rotated by a motor 9 along a guide 11 in an X-axis direction. The sensor movement stage 5 is provided with a wafer flatness measurement sensor 12 for measuring the flatness of the surface of the wafer 7 attached to the spindle 8.

The transfer unit 2 is provided with a plurality of racks 13, a plurality of wafer containers 14 mounted on the respective racks 13, a wafer carrier robot 15, and a wafer transfer robot 16. The wafer container 14 contains a number of wafers 7 in such a manner as to stack those wafers in a vertical direction. The plurality of wafer containers 14 are aligned in a row in the X-axis direction. The wafer carrier robot 15 is horizontally movable in the X-axis direction along a guide 17, and is also movable up and down in a vertical direction. The wafer carrier robot 15 has a horizontal articulated arm 18 which passes the wafer 7 between each wafer container 14 and the wafer transfer robot 16.

The wafer transfer robot 16 comprises a base 20 which is horizontally movable in a Z-axis direction along a guide 19, a 45-degree arm 21 which extends to a 45-degree angle to a Z axis and a Y axis on the base 20, namely in the direction of a vector sum of vectors in the Z-axis direction and a Y-axis direction when the magnitude of the vectors is equal to each other, and two transfer arms 22 (22a and 22b) attached to an end of the 45-degree arm 21 rotatably about a shaft of the 45-degree arm 21. The transfer arms 22 are attached to the 45-degree arm 21 so that one transfer arm 22a points to the Z-axis direction when the other transfer arm 22b points to the Y-axis direction. The positions of the transfer arms 22a and 22b are exchanged with each other when the 45-degree arm 21 rotates 180 degrees. When the transfer arm 22 points to the Y-axis direction, the transfer arm 22 passes the wafer to the wafer carrier robot 15.

A mechanism by which the transfer arm 22 transfers the wafer 7 to the spindle 8 of the main unit 1 will be hereinafter described.

Figure 3:
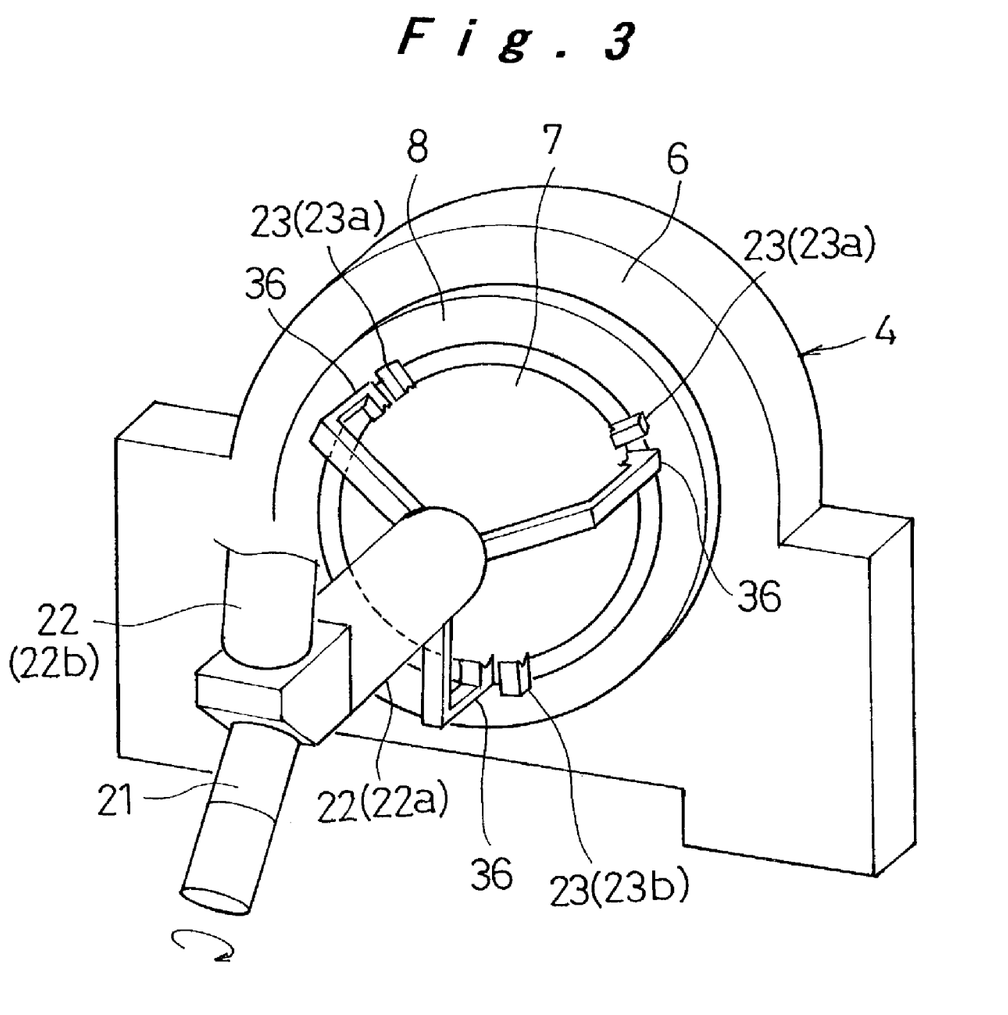
FIG. 3 is a perspective view of the main unit and transfer arms according to the embodiment.
Figure 4A:
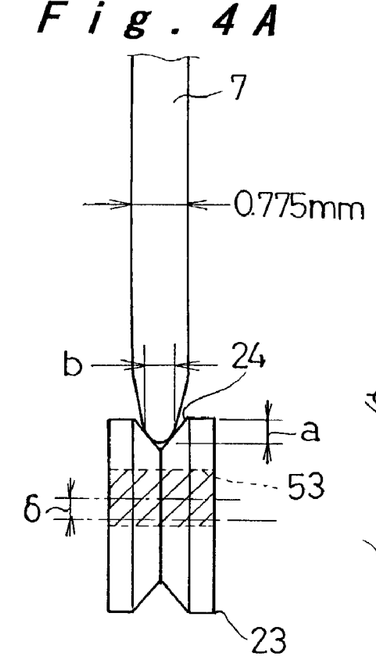
FIG. 4A is a side view showing a holding condition of the wafer by a holder claw of a spindle according to the embodiment.
Figure 4B:
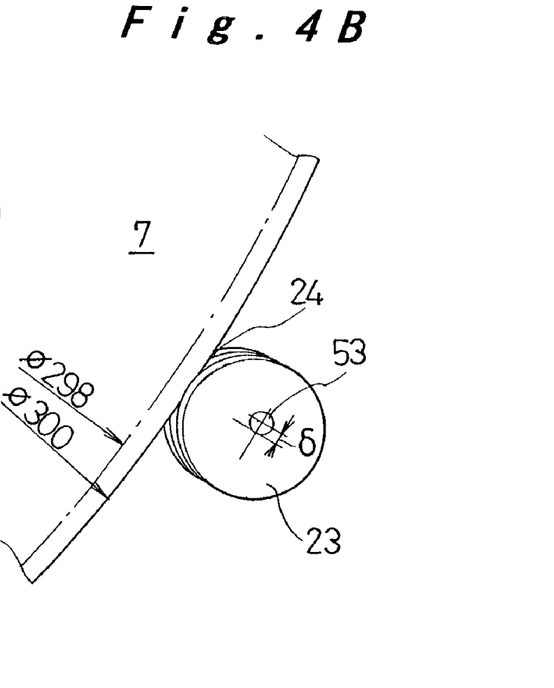
FIG. 4B is a perspective view of the holding condition.

On the surface of the spindle 8 opposed to the transfer arm 22, as shown in FIG. 3, a plurality of (three in this embodiment) holder claws 23 are provided along the inner periphery of the spindle 8 and spaced at almost equal intervals. Referring to FIG. 4A, a groove 24 for holding the outer periphery of the wafer 7 is formed in the end surface of each holder claw 23 which protrudes inwardly from the inner periphery of the spindle 8. The outer periphery of the wafer 7 of 300 mm in diameter and 0.775 mm in thickness is engaged in the groove 24. The wafer flatness measurement sensor 12 measures the flatness of the wafer 7 within the area of 298 mm in diameter, so that the holder claws 23 have to include a radial holding margin "a" of approximately 0.5 mm and a thickness holding margin "b" of approximately 0.5 mm. FIGS. 1, 3, 5, 6A, and 7A to 7D show rectangular shaped holder claws 23 with the groove 24 in the one end surface thereof, for the purpose of easy understanding of action. In this embodiment, however, the round shaped holder claws 23 with the groove 24 formed in the whole outer periphery thereof, as shown in FIGS. 4A and 4B, are used for realizing easy alignment as described above. An attachment hole 53 of the holder claw 23 is formed eccentrically, so that it is possible to attach the holder claw 23 to the spindle 8 at any rotational position.

Figure 5:
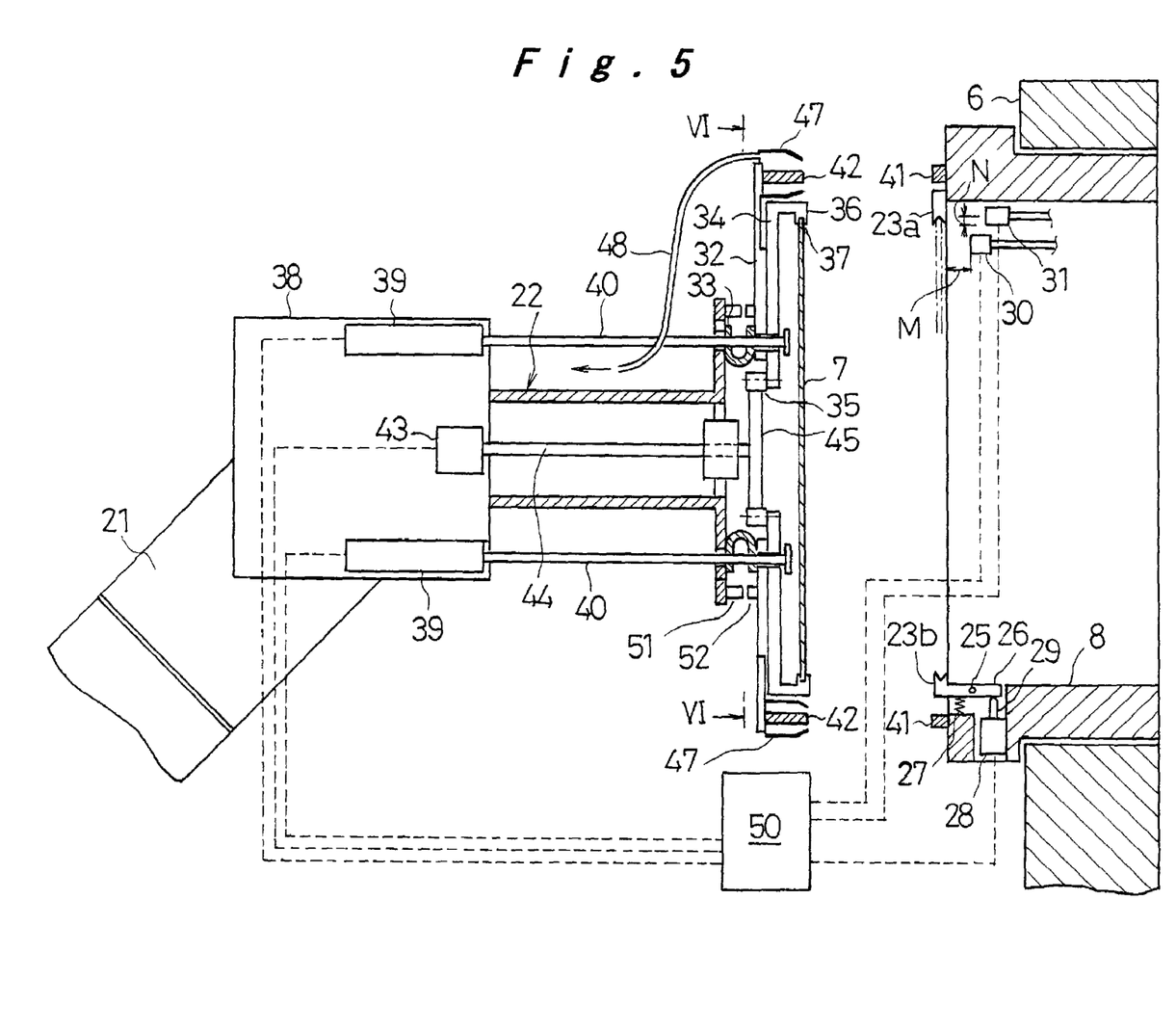
FIG. 5 is a longitudinal sectional view of the transfer arm and the spindle according to the embodiment.

Of the three holder claws 23, two holder claws 23 are fixed, while the other is movable in a radial direction. The fixed ones are hereinafter called fixed claws 23a, and the other is called a movable claw 23b. Referring to FIG. 5, the movable claw 23b is attached to the end of a lever 26 which is attached on the spindle 8 with a shaft 25 so as to be rotatable around the shaft 25. The movable claw 23b is urged toward the center of the spindle 8 by the biasing force of a spring 27 disposed between the spindle 8 and the lever 26. A plunger 29 of a solenoid 28 makes contact with the rear end of the lever 26. When the solenoid 28 is in OFF, the movable claw 23b moves to a hold position in which the movable claw 23b can hold the wafer 7. When the solenoid 28 is in ON, the movable claw 23b moves to a retractive position in which the movable claw 23b cannot hold the wafer 7.

Figure 6A:
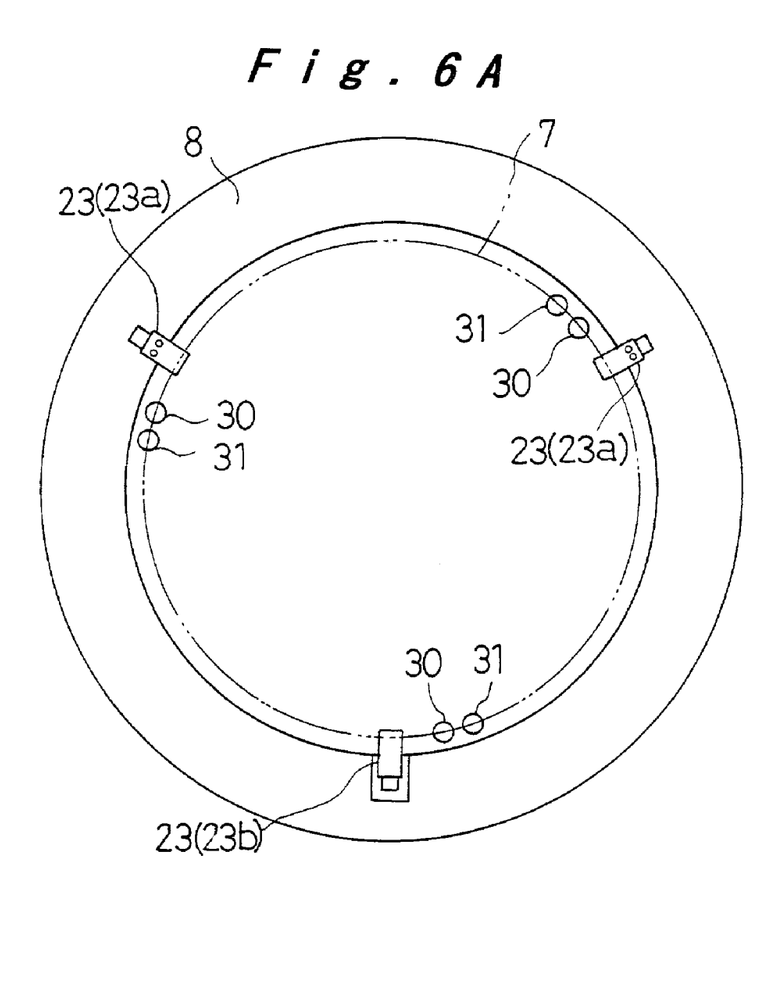
FIG. 6A is a cross sectional view taken along the line VI—VI in FIG. 5 in the holding condition of the wafer according to the embodiment.
Figure 8A:
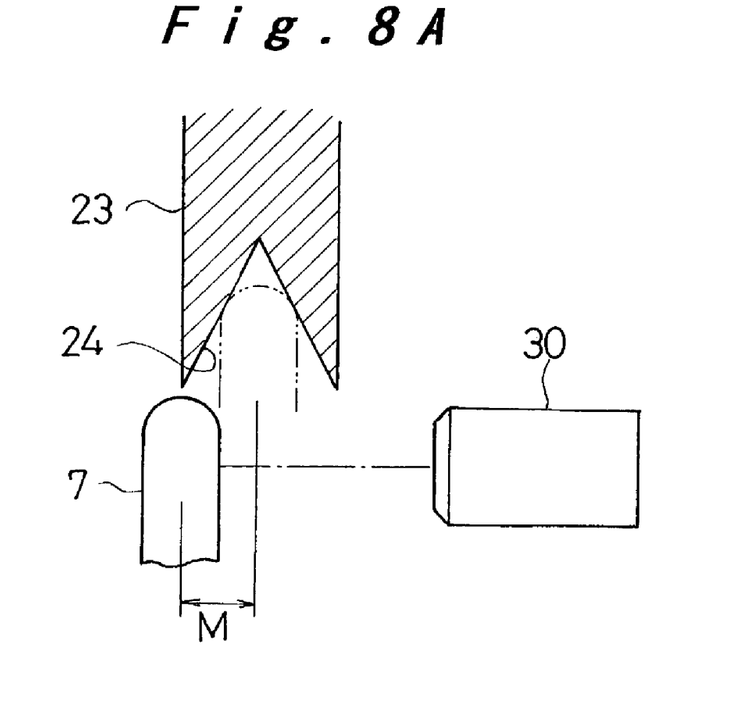
FIG. 8A is a sectional view of the detecting condition by a deviating position detection sensor.
Figure 8B:
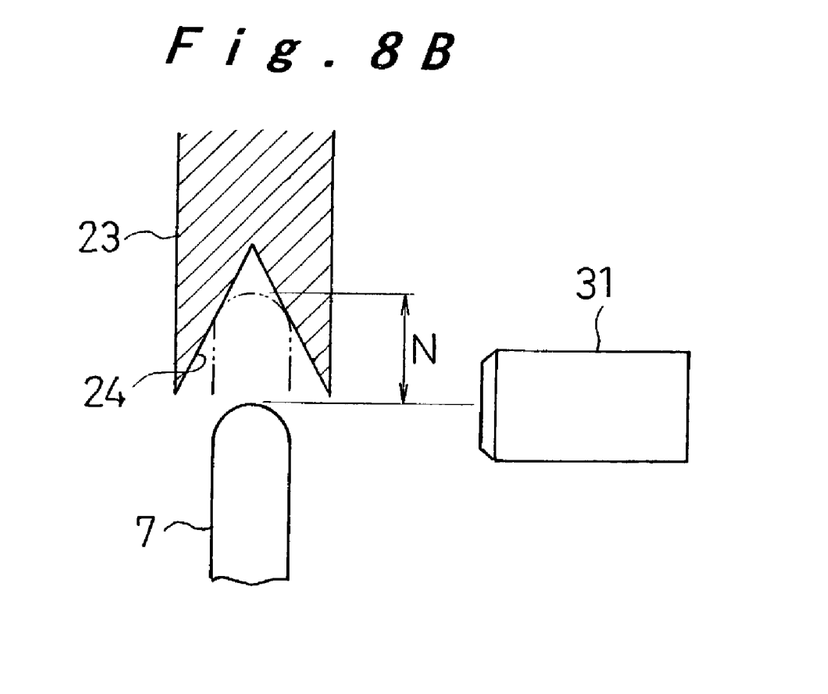
FIG. 8B is a sectional view of the detecting condition by a radial position detection sensor.

Referring to FIG. 6A, three pairs of a deviating position detection sensor 30 and a radial position detection sensor 31 are provided along the inner periphery of the spindle 8 and spaced at equal intervals on a fixed member (not illustrated). The deviating position detection sensor 30, shown in FIG. 8A, detects the position "M" of the outer periphery of the wafer 7 held by the holder claws 23 from the center of the groove 24 in the thickness direction, namely a deviating position "M." The radial position detection sensor 31, as shown in FIG. 8B, detects the position "N" of the outer periphery of the wafer 7 from the groove 24 in the radial direction. In mounting and dismounting the wafer 7, as shown in FIG. 6A, the spindle 8 is stopped so that the movable claw 23b is positioned at the lowermost position of the spindle 8. Each sensor pair (30 and 31) is disposed in a position a predetermined angle apart from each holder claw 23 along the inner periphery of the spindle 8, when the spindle 8 stops.

Figure 6B:
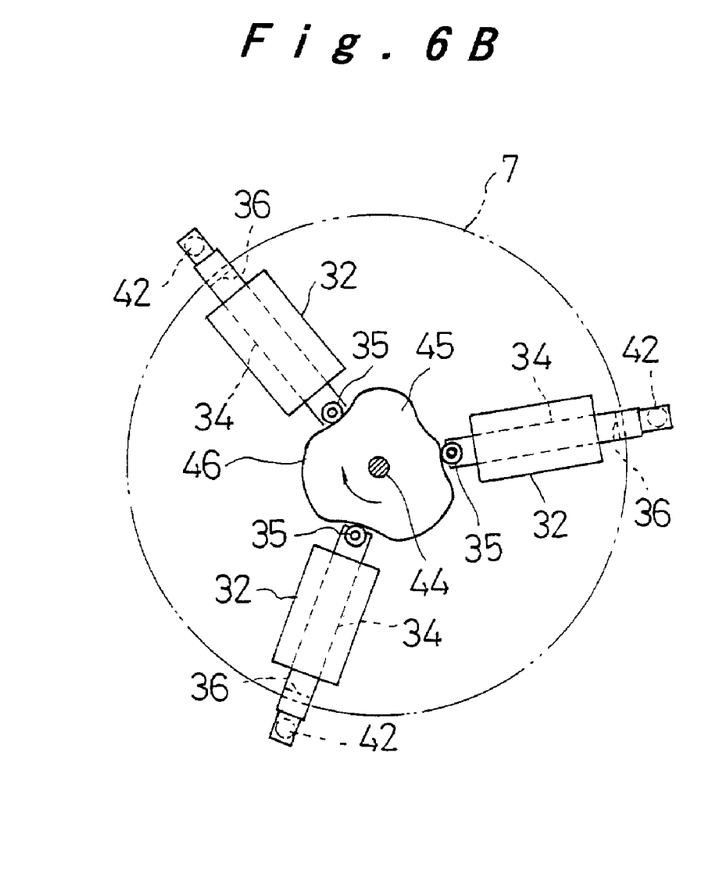
FIG. 6B is a front view showing a movement mechanism of grasp claws of the transfer arm in the holding condition.

On the other hand, referring to FIGS. 5 and 6B, three guide members 32 are secured to the end of the transfer arm 22 via U-shaped springs 33 in the radial direction of the spindle 8 with spacing at equal intervals. On each guide member 32, a finger member 34 is attached slidably in the radial direction of the spindle 8. When the spindle 8 stops in such a manner that the movable claw 23b is positioned at the lowermost position of the spindle 8, each finger member 34, as shown in FIGS. 6A and 6B, is disposed in the vicinity of each holder claw 23 of the spindle 8, namely, is in a position a predetermined angle (approximately 15 degrees, for example) apart from each holder claw 23 along the inner periphery of the spindle 8. Each finger member 34 is urged toward the center of the spindle 8 by a spring (not illustrated). A cam follower 35 having a roller is disposed on the inner end of each finger member 34 in the radial direction. The outer end of each finger member 34 bends in a U-shape, to form grasp claw 36. In the end face of the grasp claw 36, a groove 37 is formed for grasping the wafer 7. When the flatness of the wafer 7 is measured, the grasp claws 36 retract, in contrast to the holder claws 23 of the spindle 8, so that the depth of the groove 37 may be deeper than that of the holder claw 23, and the depth thereof is set to 2–3 mm in the present embodiment.

A rod 40 is disposed between an arm base 38 of the transfer arm 22 and each guide member 32. An actuator 39 provided in the arm base 38 protrudes and retracts the rod 40 in the axial direction of the transfer arm 22. When the drive of the actuator 39 swings the guide member 32 via the rod 40, the grasp claws 36 of the finger members 34 move in the thickness direction of the wafer 7. First stoppers 51 are disposed on the end face of the transfer arm 22 at positions opposed to each guide member 32, and second stoppers 52 opposed to the first stoppers 51 are disposed on the guide members 32. The first and second stoppers 51 and 52 determine the swing end of the guide members 32, in which the actuator 39 swings the guide members 32 to a direction apart from the spindle 8 via rod 40. In moving the rod 40 to a certain degree (approximately 3 mm) in an opposite direction, the drive of the rod 40 is released. The ends of the guide members 32 protrude from the ends of the finger members 34. The end of each guide member 32 is provided with a second contact face 42, which makes contact with a first contact face 41 provided in the vicinity of each holder claw 23 of the spindle 8. The positions of the first and second contact faces 41 and 42 in the thickness direction of the wafer 7 are adjusted in advance so that the centers of grasp claws 36 in the thickness direction of the wafer 7 agree with the centers of holder claws 23 in the direction.

A camshaft 44 is inserted in the transfer arm 22. A cam drive motor 43 provided in the arm base 38 rotates the cam shaft 44. A cam plate 45 is fixed on the end of the camshaft 44 which protrudes from the end of the transfer arm 22. Referring to FIG. 6B, a cam face 46 composed of approximately three ridges and troughs are formed on the outer periphery of the cam plate 45. The cam followers 35 of the finger members 34 roll on the cam face 46.

A dust aspiration cover 47 in the shape of a cylinder with a tapered end surrounds the second contact face 42. A dust aspiration tube 48 is inserted in space inside the dust aspiration cover 47, to eliminate the dust generated by the contact between the contact faces 41 and 42.

The wafer transfer unit according to this embodiment is provided with a control unit 50. The control unit 50 controls the solenoid 28, the cam drive motor 43, the actuator 39, and the like, on the basis of signals from the deviating position detection sensor 30 and the radial position detection sensor 31 provided in the main unit 1, so that the wafer 7 is transferred from the transfer arm 22 to the spindle 8 of the main unit 1.

The transferring method of the wafer with the above mentioned wafer transfer unit will be hereinafter described. First, the wafer 7, taken out of the wafer container 14 by the wafer carrier robot 15, is carried to a passing position of a wafer transfer robot 16. At this time, the actuator 39 moves the rod 40 in a left direction of FIG. 5 so as to prevent the finger members 34 of the transfer arm 22 from moving by vibration or the like. Thereby, the first stoppers 51 and the second stoppers 52 make contact with each other to position the grasp claws 36 without wobbling.

Then, the transfer arm 22 of the wafer transfer robot 16 holds the wafer 7. In other words, the 45-degree arm rotates so that one of the two transfer arms 22 (22b of FIGS. 1 and 3) points upward, and the cam drive motor 43 rotates the cam plate 45 via the cam shaft 44. The cam followers 35 of the finger members 34 roll on the cam plate 45 from the trough to the ridge so that the grasp claws 36 of the finger members 34 move to an open position. In this state, the transfer arm 22 approaches the wafer 7 held by the horizontal articulated arm 18 of the wafer carrier robot 15. Then, the cam drive motor 43 rotates the cam plate 45 via the cam shaft 44, and the cam follower 35 of the finger member 34 rolls from the ridge to the trough of the cam plate 45 to close the grasp claws 36 of the finger members 34, thereby grasping the wafer 7.

The transfer arm 22 holding the wafer 7 rotates 180 degrees so that the transfer arm 22 is in a horizontal position along the Z-axis direction. Then, the wafer 7 is moved to the spindle 8 of the main unit 1. At this time, the transfer arm 22 is moved down so that the shaft center C1 of the transfer arm 22 is shifted downward with respect to the shaft center C2 of the spindle 8, while the movable claw 23b of the spindle 8 is set in the retractive position not to prevent the wafer 7 from getting into the plane of the holder claws 23 of the spindle 8.

According to the above described transfer operation, it is possible to transfer the wafer 7 without dropping the dust and the like thereon, because the front surface of the wafer 7 is not positioned beneath any movable portion of the unit including the transfer arm 22 and the like during the operation.

The spindle 8 is stopped so that the movable claw 23b is positioned at the lowermost position of the spindle 8. Therefore, each finger member 34 of the transfer arm 22 approaches the vicinity of each holder claw 23 of the spindle 8, namely a position a predetermined angle (approximately 15 degrees in this embodiment) apart from each holder claw 23 along the inner periphery of the spindle 8. In a case where the grasp claw 36 of the finger member 34 of the transfer arm 22 is 15 degrees apart from the holder claw 23 of the spindle 8 like this, the distance between the grasp claw 36 and the holder claw 23 is approximately 40 mm in the wafer 7 of 300 mm in diameter. In the whole wafer 7 of 300 mm in diameter, the amount of warpage is generally smaller than or equal to 150 µm, so that the amount of deviation in the thickness direction between two points 40 mm apart from its periphery is smaller than 6 µm. This amount of deviation in the thickness direction corresponds to less than 1 percent of 775 µm, which is the thickness of the wafer 7. Displacing the grasp claw 36 of each finger member 34 of the transfer arm 22 in the vicinity of each holder claw 23 of the spindle 8, in this way, makes it possible to reliably transfer the wafer 7.

After bringing the wafer 7 close to the spindle 8 in approximately 0.5 mm, the actuator 39 gradually moves the rod 40 to the spindle 8 (rightward of FIG. 5). Thus, the finger members 34 move rightward, until the second contact face 42 attached on the end of the guide member 32 comes into contact with the first contact face 41. The rod 40 further moves approximately 0.5 mm rightward by activating the actuator 39, after the first and second contact faces 41 and 42 come into contact with each other. The urge of the U-shaped spring 33 fixes the positions of the finger members 34 and the grasp claws 36, with the first and second contact faces 41 and 42 being tightly in contact with each other. According to this positioning method, it is possible to securely transfer the wafer 7 to the spindle 8 of the main unit 1 without any complication such as feedback control and the like.

Figure 7A:
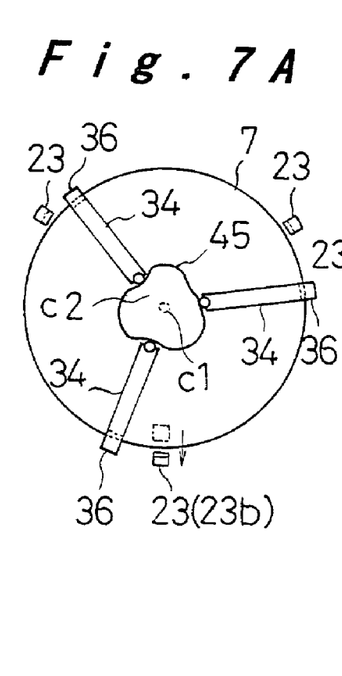
FIGS. 7A to 7D are explanatory views of a transfer process of the wafer by the transfer arm according to the embodiment.
Figure 7B:
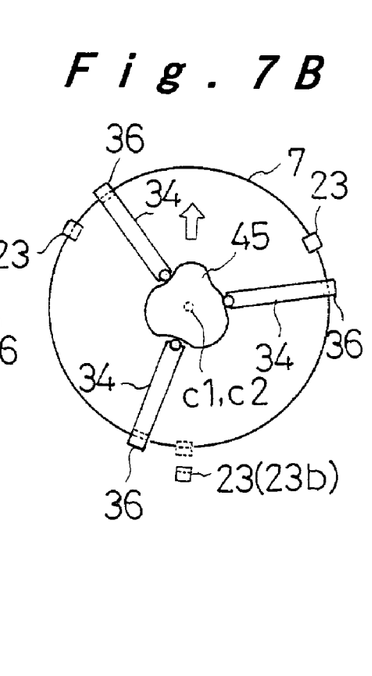

When the wafer 7 gets into the plane of the holder claws 23 of the spindle 8, as shown in FIG. 7B, the transfer arm 22 moves upward so that the shaft center C1 of the transfer arm 22 coincides with the shaft center C2 of the spindle 8. Thus, the outer periphery of the wafer 7 is engaged in the grooves 24 of the fixed claws 23a of the holder claws 23 of the spindle 8.

There is a case, however, in which the wafer 7 is not engaged in the grooves 24 of the holder claws 23 due to the warpage of the wafer 7, because the holding margin of the wafer 7 is small. Accordingly, the deviating position detection sensor 30 disposed inside the spindle 8 detects the deviation of the wafer 7 from the center of the groove 24 in the thickness direction, namely the deviating position "M" in order to prevent an accident like the drop of the wafer 7 with raising an alarm.

The radial position detection sensor 31 disposed inside the spindle 8 detects the deviation "N" of the outer periphery of the wafer 7 from the groove 24 in the radial direction, in order to confirm reliable attachment.

In this way, the wafer 7 with small holding margins is securely engaged in the grooves 24 of the holder claws 23. It is also possible to eliminate a trouble that the spindle 8 rotates with the uncertainly held wafer 7 and the wafer 7 falls off.

Figure 7C:
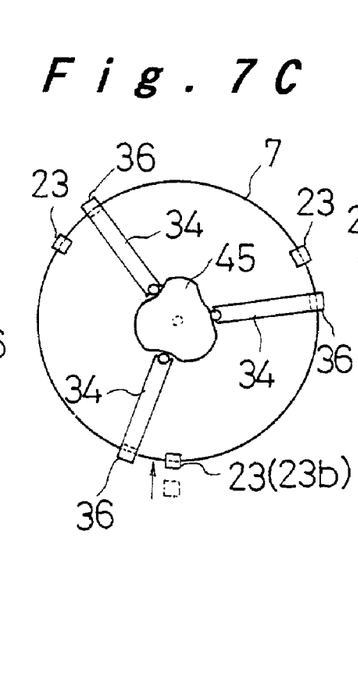
Figure 7D:
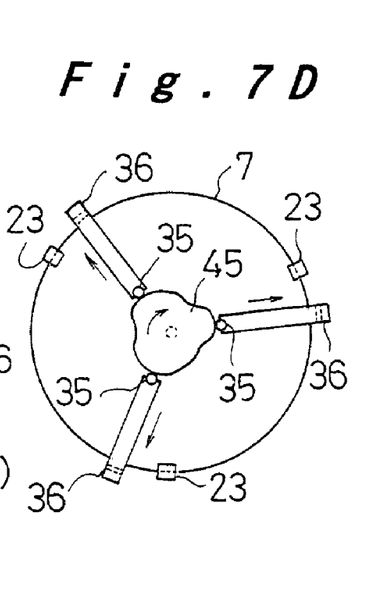

When the wafer 7 is neatly engaged in the grooves 24 of the holder claws 23, as shown in FIG. 7C, the solenoid 28 is turned on and the movable claw 23b of the spindle 8 moves to the hold position in order to completely hold the wafer 7. Then, the cam drive motor 43 rotates the cam plate 45 via the cam shaft 44, as shown in FIG. 7D, and the cam followers 35 of the finger members 34 roll on the cam plate 45 from the trough to the ridge so that the grasp claws 36 of the finger members 34 are opened. Thus, if the wafer 7 warps, the holder claws 23 of the spindle 8 reliably hold the wafer 7 without dropping it down, and the wafer flatness measurement sensor 12 measures the flatness of the wafer 7 surely. The transfer arm 22 moves out of the way of the measurement by the wafer flatness measurement sensor 12, and completes transfer operation.

After the wafer 7 is transferred to the spindle 8 like this, the spindle 8 is actuated to rotate the wafer 7. The sensor movement stage 5 moves in the X-axis direction, and the wafer flatness measurement sensor 12 measures the flatness of the surface of the wafer 7. The wafer 7 is classified into pass and fail in accordance with the measurement result of the flatness of the wafer 7.

Then, the wafer 7 is dismounted from the spindle 8. Operation to dismount the wafer 7 from the holder claws 23 of the spindle 8 and return it to the wafer container 14 is just opposite to the above described transfer operation. The confirmed wafers 7 are subjected to predetermined processes, and are made into substrates.

Figure 4C:
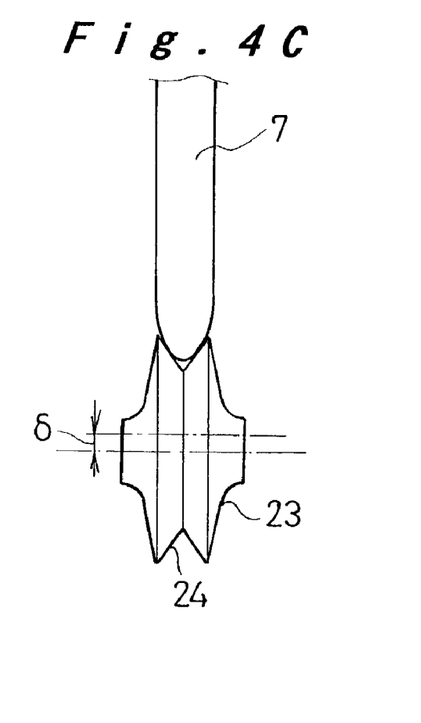
FIG. 4C is a side view showing a variation of the embodiment of the holder claw with different shape.

For easy maintenance, as shown in FIGS. 4A and 4B, the holder claw 23 is in the shape of a circle with the groove 24 formed in the outer periphery thereof, and the attachment hole 53 to the spindle 8 is formed eccentrically in a predetermined distance δ. The position of the holder claw 23 is arbitrarily adjustable by rotation. In exchanging the holder claw 23, the holder claw 23 is rotated in the radial direction of the wafer 7, so that the hold position of the wafer 7 is decided with ease. The sectional surface of the holder claw 23 is not limited to a round plate in shape as shown in FIGS. 4A and 4B, but may be a pulley in shape with a groove 24 formed in the outer periphery thereof as shown in FIG. 4C.

In the above embodiment, the transferred thin plate is the semiconductor wafer 7 made of silicon, but a metal plate, a ceramic plate, and a resin plate for making a magnetic disc may be transferred in addition to the semiconductor wafer 7. The shape of the thin plate may not be round.

As described above, according to the method for transferring the thin plate and the transfer unit thereof according to the present invention, the thin plate, which is extremely thin and easy to warp, is held with the transfer arm rotating about the shaft which is in the middle of the surfaces of the thin plate before and after the transfer. Therefore, the thin plate with the small holding margins is rapidly transferred without the adhesion of the dust. The transfer unit is manufactured at low cost, and is easily assembled. The maintenance of the transfer unit is also easy.

Although the present invention has been described with respect to the preferred embodiment in order to clarify the technical contents of the present invention, the preset invention is not to be limited to the above embodiment but, on the contrary, various modifications will be possible without departing from the scope of claims appended hereto.

What is claimed is:

1. A method for transferring a thin plate by changing a posture of said thin plate, comprising:
   rotating a transfer arm that holds said thin plate about a shaft which extends in a direction of a vector sum of a first vector perpendicular to a surface of said thin plate before transfer, and a second vector perpendicular to said surface of said thin plate after the transfer, when the magnitude of said first and second vectors is equal to each other to change said posture of said thin plate, the rotation of the transfer arm being such that said shaft is positioned under said thin plate during the entire transfer.

2. The method for transferring a thin plate according to claim 1, further comprising providing two transfer arms to the shaft, such that when one of said transfer arms is positioned for mounting said thin plate, the other of said transfer arms is positioned for dismounting said thin plate.

3. The method for transferring a thin plate according to claim 1, wherein the plane containing said surface of said thin plate before the transfer and the plane containing said surface of said thin plate after the transfer form an angle of 90 degrees, and said transfer arm rotates about said shaft at an angle of 45 degrees to change said posture of said thin plate.

4. An apparatus for transferring a thin plate by changing a posture of said thin plate, comprising:
   a transfer arm for grasping said thin plate, said transfer arm being attached to and rotatable about a first end of a shaft which extends in a direction of a vector sum of a first vector that extends perpendicular to a surface of said thin plate before transfer, and a second vector that extends perpendicular to said surface of said thin plate after the transfer, when the magnitude of said first and second vectors is equal to each other, such that during the entire transfer said shaft is positioned under said thin plate.

5. The apparatus for transferring a thin plate according to claim 4, said transfer arm comprising two transfer arms attached to a shared base on said first end of said shaft, wherein when one of said transfer arms is positioned for mounting said thin plate, the other of said transfer arms is positioned for dismounting said thin plate.

6. The method for transferring said thin plate according to claim 1, wherein one of the first and second vectors extends upwardly and the other of the first and second vectors extends horizontally.

7. The apparatus for transferring a thin plate according to claim 4, wherein one of the first and second vectors extends upwardly and the other of the first and second vectors extends horizontally.

* * * * *